United States Patent
Chen et al.

(10) Patent No.: US 8,860,478 B2
(45) Date of Patent: Oct. 14, 2014

(54) PHASE-LOCKED LOOP WITH LOOP GAIN CALIBRATION, GAIN MEASUREMENT METHOD, GAIN CALIBRATION METHOD AND JITTER MEASUREMENT METHOD FOR PHASE-LOCKED LOOP

(71) Applicant: National Chiao Tung University, Hsinchu (TW)

(72) Inventors: Wei-Zen Chen, Hsinchu (TW); Shu-Chin Chuang, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 26 days.

(21) Appl. No.: 13/840,134

(22) Filed: Mar. 15, 2013

(65) Prior Publication Data
US 2014/0077849 A1    Mar. 20, 2014

(30) Foreign Application Priority Data
Sep. 14, 2012 (TW) .............................. 101133629 A

(51) Int. Cl.
*H03L 7/08* (2006.01)
*G01R 25/00* (2006.01)

(52) U.S. Cl.
CPC . *H03L 7/08* (2013.01); *G01R 25/00* (2013.01)
USPC ............. 327/156; 327/159; 327/160; 331/17; 331/44; 375/376

(58) Field of Classification Search
CPC ........... H03L 7/08; H03L 7/085; H03L 7/093; G01R 25/00
USPC ................. 327/147, 150, 151, 156, 159, 160; 331/15–17, 44; 375/373, 374, 376; 324/601
See application file for complete search history.

(56) References Cited

U.S. PATENT DOCUMENTS

| | | | |
|---|---|---|---|
| 7,750,742 B2 * | 7/2010 | Cho et al. | 331/18 |
| 8,183,936 B2 * | 5/2012 | Chen et al. | 331/17 |

OTHER PUBLICATIONS

Chuang et al., "An All-Digital Fractional-N Frequency Synthesizer with Background Calibration", A Thesis Submitted to Department of Electronics and Institute of Electronics College of Electrical and Computer Engineering National Chiao-Tung University, pp. 1-92 (Mar. 16, 2012).

* cited by examiner

*Primary Examiner* — Patrick O'Neill
(74) *Attorney, Agent, or Firm* — Edwards Wildman Palmer LLP; Peter F. Corless; Steven M. Jensen

(57) ABSTRACT

The invention provides a phase-locked loop with loop gain calibration and methods for measuring an oscillator gain, gain calibration and jitter measurement for a phase-locked loop. The method for measuring an oscillator gain of a phase-locked loop includes the steps of providing a varying code at an input end of the oscillator; outputting excess reference phase information by a reference phase integral path and outputting excess feedback phase information based on the varying code by a feedback phase integral path; and obtaining an estimated gain information of the oscillator based on the excess reference phase information and the excess feedback phase information.

9 Claims, 9 Drawing Sheets

PHASE-LOCKED LOOP WITH LOOP GAIN CALIBRATION, GAIN MEASUREMENT METHOD, GAIN CALIBRATION METHOD AND JITTER MEASUREMENT METHOD FOR PHASE-LOCKED LOOP

CROSS-REFERENCES TO RELATED APPLICATIONS

This application claims under 35 U.S.C. §119(a) the benefit of Taiwanese Application No. 101133629, filed Sep. 14, 2012, the entire contents of which is incorporated herein by reference.

FIELD OF THE INVENTION

The present invention relates to a phase-locked loop with loop gain calibration, a gain measurement method, a gain calibration method and a jitter measurement method for a phase-locked loop.

BACKGROUND OF THE INVENTION

A frequency synthesizer plays a very important role in current communication systems, which may be wired or wireless receivers, mobile phones or satellite receivers. A frequency synthesizer is used for generating a periodic signal having known frequency and phase relationships with a reference signal. This generated clock signal can be used as a clock source for a processor in a high-speed data transfer interface, a sampling clock for an analog-to-digital converter, or a local oscillator signal in a radio transmitter for frequency mixing. Various frequency synthesis technologies have been proposed over years, such as phase-locked loop (PLL), direct digital frequency synthesis (DDFS), frequency mixing, and the like. In these frequency synthesis technologies, phase-locked loop offers a frequency synthesizer which has a number of performances at the same time.

A PLL is a frequency control system with a negative feedback. By sensing a phase error between the feedback path and an input reference signal, the PLL generates a signal associated with the phase error to control the output frequency of an oscillator in order to achieve constant frequency and phase relationships with the reference signal. PLLs can further be used to modulate or demodulate signals.

In general, a phase-locked loop is designed based on phase noise, jitter performance, adjustable bandwidth, power consumption, the area of a chip and etc. With the rapid progression of manufacturing processes, in low-voltage deep sub-micrometer CMOS manufacturing process, the integration density of digital circuits on a single chip is increased, and parasitic capacitance and supply voltage are reduced, such that the digital circuits have higher operating frequencies and lower power consumptions. On the contrary, analog circuits have smaller voltage tolerance, larger leakage current and noise influence under the SoC environment, so as to increase the difficulty in designing a high-performance phase-locked loop.

FIG. 1 shows the structure of a traditional non-integer PLL consisting of a phase frequency detector (PFD) 10, a charge pump 11, a loop filter 12, a voltage controlled oscillator (VCO) 13, a multi-modulus frequency divider 14, and a delta-sigma modulator ($\Sigma\Delta$) 15. The bandwidth of the non-integer PLL is determined by the charge/discharge current value of the charge pump 11, the resistance and capacitance of the loop filter 12, and the gain of the VCO 13. Unfortunately, the above parameters are influenced by process variations, resulting in deviations of the actual circuit characteristics from the original design values, and hindering the achievement of best noise bandwidth. Also, the multi-modulus frequency divider needs to be redesigned for different manufacturing processes. This is not only time consuming, but also results in more power consumption.

Therefore, it is an urgent need to develop a method that is capable of self-calibrating the bandwidth of a phase-locked loop and a method for measuring the output noise signal of the phase-locked loop.

SUMMARY OF THE INVENTION

The present invention provides a method for measuring an oscillator gain of a phase-locked loop (PLL), in which the PLL includes a feedback phase integral path with a loop filter, an oscillator and a counter, a reference phase integral path with a delta-sigma modulator and an accumulator, and a phase quantizer for comparing outputs of the feedback phase integral path and the reference phase integral path, and the method includes the following steps of: (1) providing a varying code at an input end of the oscillator; (2) outputting excess reference phase information by the reference phase integral path and outputting excess feedback phase information based on the varying code by the feedback phase integral path; and (3) obtaining an estimated gain information of the oscillator based on the excess reference phase information and the excess feedback phase information.

The present invention further provides a method for calibrating a loop gain of a phase-locked loop (PLL), in which the PLL includes a feedback phase integral path with a loop filter, an oscillator and a counter, a reference phase integral path with a delta-sigma modulator and an accumulator, and a phase quantizer for comparing outputs of the feedback phase integral path and the reference phase integral path, and the method includes the following steps of: (1) providing a varying code at an input end of the oscillator; (2) outputting excess reference phase information by the reference phase integral path and outputting excess feedback phase information based on the varying code by the feedback phase integral path; (3) obtaining estimated gain information of the oscillator based on the excess reference phase information and the excess feedback phase information; (4) obtaining a gain correcting factor based on a target gain information and the estimated gain information; and (5) controlling an output frequency of the oscillator using a product of a frequency tuning word multiplied by the gain correcting factor in order to calibrate the gain of the oscillator.

The present invention further provides a method for measuring jitter noise of an output signal of a phase-locked loop (PLL), in which the PLL includes a feedback phase integral path with a loop filter, an oscillator and a counter, a reference phase integral path with a delta-sigma modulator and an accumulator, and a phase quantizer for comparing outputs of the feedback phase integral path and the reference phase integral path, and the method includes the following steps of: (1) obtaining a frequency tuning word while the loop is stable after calibrating the gain of the oscillator; and (2) calculating an estimated amount of jitter noise of the oscillator based on a product of the frequency tuning word at an input end of the oscillator multiplied by a target gain information and a center frequency of the frequency tuning word.

The present invention also provides a frequency synthesizer with loop gain calibration, including: a feedback phase integral path including a loop filter for outputting a frequency tuning word; an oscillator for receiving a varying code and the frequency tuning word and generating an output frequency;

and a counter for receiving the output frequency and calculating rising or falling edges of the output frequency to generate excess feedback phase information; a reference phase integral path including a delta-sigma modulator for receiving a sum of a fractional frequency tuning word and phase difference information; and an accumulator for accumulating a sum of an output of the delta-sigma modulator and an integer frequency tuning word and outputting excess reference phase information based on a reference frequency; a phase quantizer for comparing the excess feedback phase information and the excess reference phase information and outputting the phase difference information to the feedback phase integral path and reference phase integral path; and a gain estimator for receiving the excess phase difference information, calculating estimated gain information of the oscillator based on the excess phase difference information, and calculating a gain correcting factor based on a target gain information and the estimated gain information to allow the oscillator to adjust the output frequency based on a product of the frequency tuning word multiplied by the gain correcting factor.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE EMBODIMENTS

The present invention is described by the following specific embodiments. Those with ordinary skills in the arts can readily understand other advantages and functions of the present invention after reading the disclosure of this specification. Various details in this specification can be modified or changed based on different aspects and applications without departing from the spirit of the present invention. The aspects of the present invention are described in more details in the following embodiments, but it should be noted that these embodiments are by no means intended to limit the scope of the present invention in any way.

Figure 2:
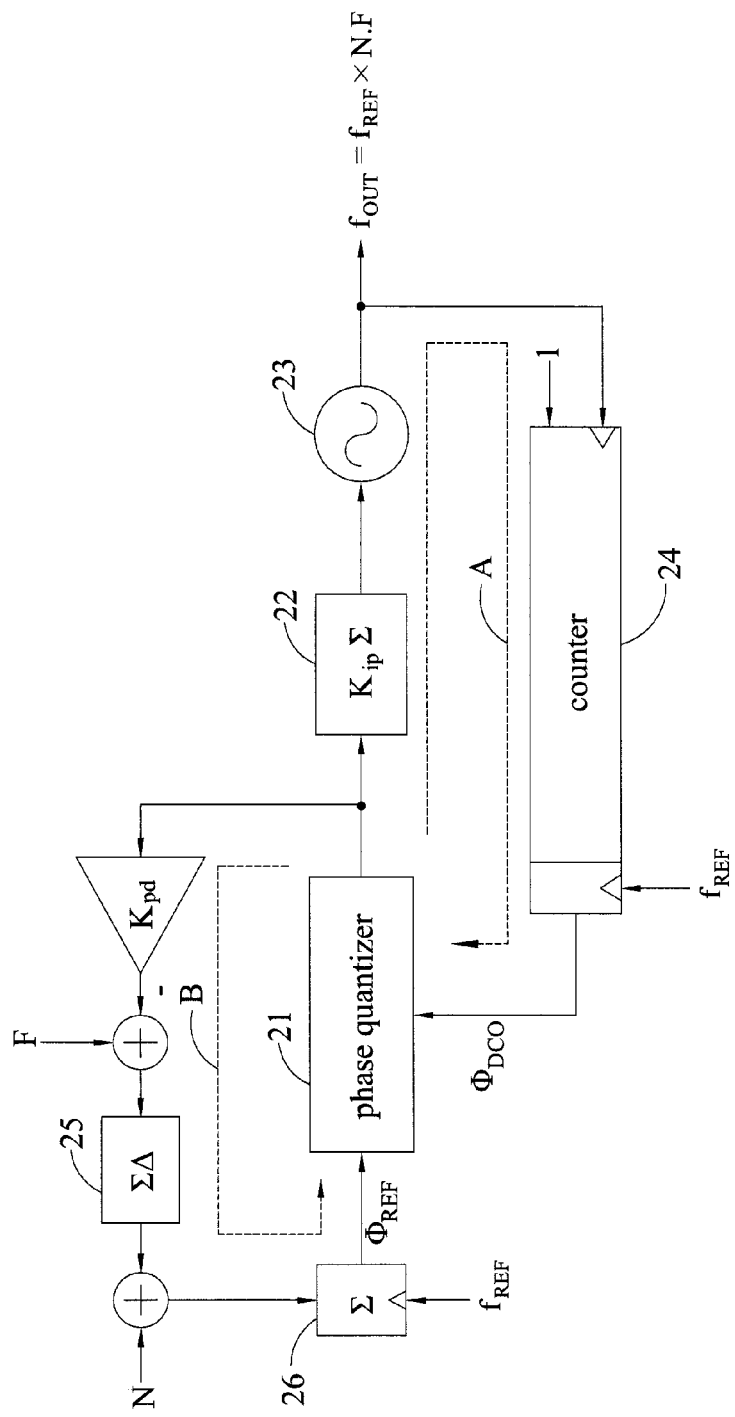
FIG. 2 is a schematic diagram showing the structure of a digital non-integer frequency synthesizer.

Referring to FIG. 2, a non-integer all digital phase-locked loop (ADPLL) is shown, which mainly includes a feedback phase integral path A and a reference phase integral path B. In the feedback phase integral path A, the output of a phase quantizer 21 is inputted into a loop filter 22 where weighted ($K_{ip}$) accumulation is performed, and the digital tuning word of the loop filter 22 is inputted to an oscillator 23. The rising edges of the output frequency ($f_{OUT}$) of the oscillator 23 are then calculated by a counter 24. The output of the counter 24 serves as the phase information of the oscillator 23 ($\Phi_{DCO}$). Further, in the reference phase integral path B, the output of the phase quantizer 21 is multiplied by a weight ($K_{pd}$), and then a fractional frequency tuning word (F) is subtracted therefrom and subsequently fed to a delta-sigma modulator 25 with a maximum resolution of $M_{dsm}$. The output of the delta-sigma modulator 25 is added with an integer frequency tuning word (N) to ideally result in, on average, a reference frequency multiplier with a fractional number. Then, the ideal reference frequency ($f_{REF}$) is inputted to an accumulator 26 in order to calculate the phase information ($\Phi_{REF}$) of the reference frequency ($f_{REF}$).

Next, the phase information ($\Phi_{DCO}$) of the feedback phase integral path A and the phase information ($\Phi_{REF}$) of the reference phase integral path B are inputted to the phase quantizer 21 and a difference therebetween is calculated at each rising edge of the reference frequency ($f_{REF}$) to generate digitized phase error information. This phase error information is again inputted to the reference phase integral path B and the feedback phase integral path A in a weighted manner. Phase locking is achieved by the feedback balance of these two phase integral paths. When phase is locked, the output signal and the reference signal have the following relationship: $f_{OUT}=f_{REF} \times N.F$, wherein $$N \cdot F = N + \frac{F}{M_{dsm}}.$$

Furthermore, in the ADPLL, the bandwidth is determined by known parameters which are the weight ($K_{ip}$) of the loop filter 22, the weight ($K_{pd}$) of the reference phase integral path B, the maximum resolution ($M_{dsm}$) of the delta-sigma modulator 25, the integer frequency tuning word (N), the fractional frequency tuning word (F), and the gain ($K_{DCO}$) of the oscillator, and among which, only the gain ($K_{DCO}$) of the oscillator is affected by variations in the physical environment of the manufacturing process and errors resulting from component mismatches. Therefore, the gain measurement and calibration methods proposed by the present invention eliminate the non-ideal effects of the physical environment of the manufacturing process and component mismatches on the oscillator gain, and the gain of the oscillator is measured and calibrated without changing other parameters, thereby achieving more stability in the bandwidth of the phase-locked loop.

First Embodiment

Figure 3:
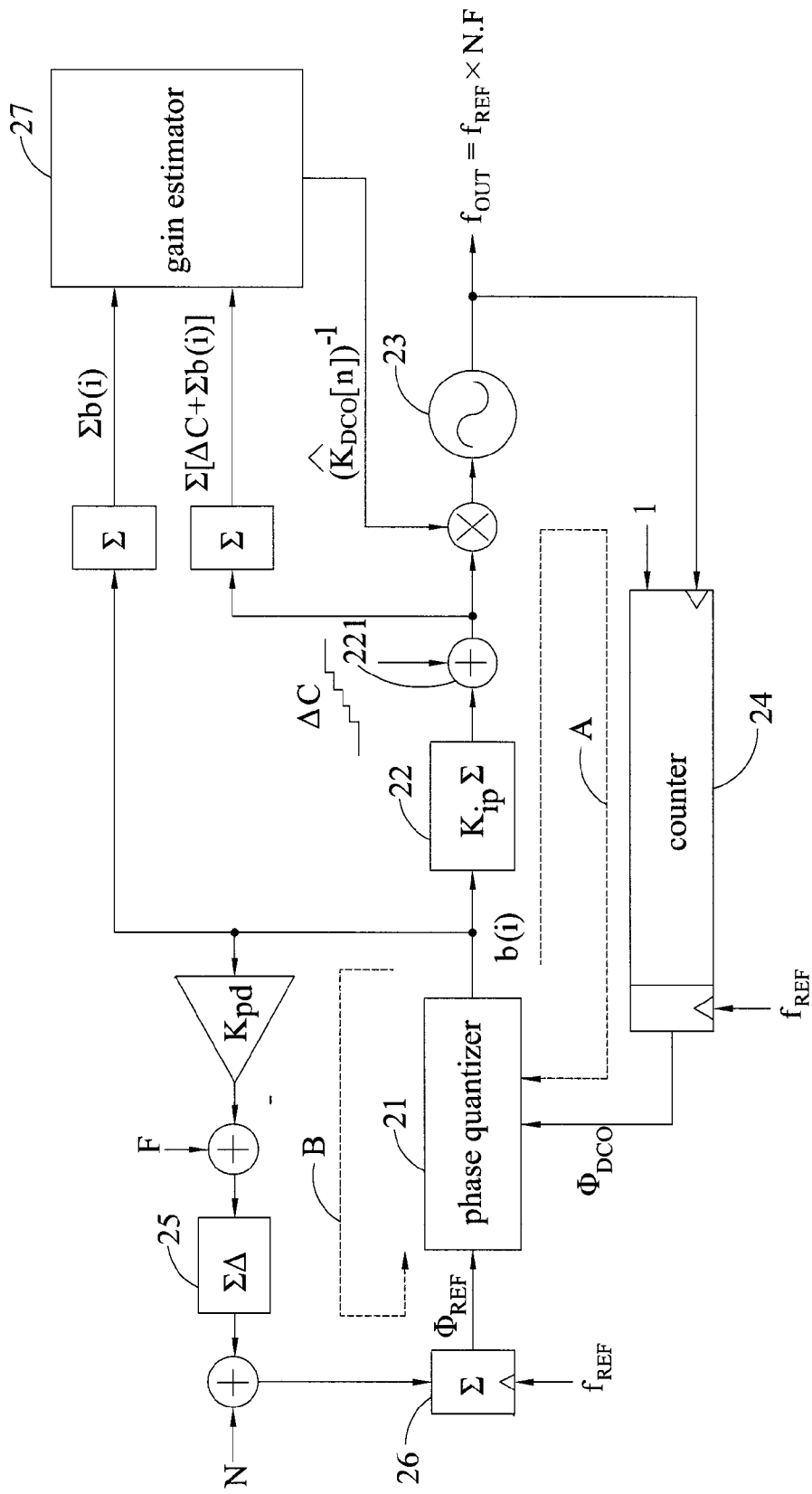
FIG. 3 is a schematic diagram showing the structure of a frequency synthesizer with loop gain calibration in accordance with the present invention.

FIG. 3 is a schematic diagram depicting the structure of a frequency synthesizer with loop gain calibration according to the present invention for illustrating the methods for measuring and calibrating the gain of a PLL, and more preferably, a non-integer all digital PLL.

In FIG. 3, the frequency synthesizer with loop gain calibration includes a feedback phase integral path A, a reference phase integral path B, a phase quantizer 21, and a gain estimator 27.

The feedback phase integral path A includes a loop filter 22, an oscillator 23 receiving the product of a frequency tuning word having a varying code (ΔC) multiplied by a gain correcting factor $(\hat{K}_{DCO}[n])^{-1}$, and a counter 24 calculating the rising edges of the output frequency of the oscillator 23 ($f_{OUT}$) and outputting excess feedback phase information ($\Phi_{DCO}$).

The reference phase integral path B includes a delta-sigma modulator 25 receiving the sum of a fractional frequency tuning word (F) and information of a phase difference, an accumulator 26 accumulating the outputs of the delta-sigma modulator 25 and an integer frequency tuning word (N). The accumulator 26 outputs excess reference phase information ($\Phi_{REF}$) in accordance with a reference frequency ($f_{REF}$).

The phase quantizer 21 receives the excess feedback phase information ($\Phi_{DCO}$) and excess reference phase information ($\Phi_{REF}$), and outputs phase difference information b(i) to the reference phase integral path B and the feedback phase integral path A.

The gain estimator 27 receives this phase difference information b(i), calculates to obtain estimated gain information of the oscillator 23 based on the excess phase difference information, and then calculates to obtain the gain correcting factor according to a target gain information and the estimated gain information. This enables the oscillator 23 to adjust the output frequency based on the product of the frequency tuning word having the varying code multiplied by the gain correcting factor, thus calibrating the gain of the oscillator 23.

The method for measuring the gain of the PLL includes the following steps of: providing a varying code (ΔC); outputting the excess reference phase information ($\Phi_{REF}$) by the reference phase integral path B using the varying code (ΔC) and outputting the excess feedback phase information ($\Phi_{DCO}$) by the feedback phase integral path A; and obtaining the estimated gain information of the oscillator 23 based on the excess reference phase information ($\Phi_{REF}$) and the excess feedback phase information ($\Phi_{DCO}$), wherein the difference between the excess reference phase information ($\Phi_{REF}$) and the excess feedback phase information ($\Phi_{DCO}$) is calculated to produce phase difference information, and the phase difference information is made to zero to obtain the estimated gain information of the phase-locked loop.

In addition, the above method for measuring the gain of the PLL may further include the step of obtaining a gain correcting factor $(\hat{K}_{DCO}[n])^{-1}$ based on a target gain information and the estimated gain information of the oscillator 23, enabling the oscillator 23 to adjust the output frequency based on the product of the frequency tuning word having the varying code (ΔC) multiplied by the gain correcting factor $(\hat{K}_{DCO}[n])^{-1}$, thus calibrating the gain of the oscillator 23.

More specifically, a slowly changing varying code (ΔC) is introduced before the oscillator 23. The speed of change of the varying code must be within the bandwidth of the whole phase-locked loop. Due to the phase tracking property of the phase-locked loop, the output of the loop filter 22 inevitably generates a digital signal opposite to the injected signal (ΔC) to offset the phase error of the output frequency ($f_{OUT}$). Undoubtedly, the output of the phase quantizer 21 will also vary in response to the introduced signal (ΔC). Since this architecture has two phase integral paths, by observing phase tracking information of these two phase integral paths on the introduced signal (ΔC), the gain of the oscillator can be extracted. Moreover, the embodiment shown in FIG. 3 can be performed during or after the phase locking process of the PLL.

The excess reference phase information ($\Delta\Phi_{REF}$) output by the reference phase integral path B can be expressed in Equation (1) below. b(i) is the output of the phase quantizer 21, i.e. the input end of the reference phase integral path B. $M_{dsm}$ is the maximum resolution of the delta-sigma modulator 25. The signal passing through the delta-sigma modulator 25 is divided by the maximum resolution $M_{dsm}$ to represent the concept of averaging. The accumulator 26 is at the end of the reference phase integral path B to add the current excess reference phase information and the excess reference phase information last stored. The rising edge of the reference clock acts as a trigger signal, so that the signal passing through the accumulator 26 will be multiplied by the reference frequency (fREF) to represent the concept of integration of each reference cycle, or that the reference frequency information $$N \cdot F = N + \frac{F}{M_{dsm}}$$

is integrated to produce the excess reference phase information ($\Phi_{REF}$).

$$\Delta\Phi_{REF} = \sum \left\{ [-b(i)] \cdot \frac{K_{pd}}{M_{dsm}} \cdot f_{REF} \right\} \qquad \text{Equation (1)}$$

The excess feedback phase information ($\Delta\Phi_{DCO}$) of the feedback phase integral path A can be expressed as Equation (2) below, wherein b(i) is the output of the phase quantizer 21, i.e. the input end of the reference phase integral path B. ($K_{ip}$) is the weight of the loop filter 22. $\Sigma b(i) \cdot K_{ip} + \Delta C$ is the output of an adder 221 following the loop filter 22. ($K_{DCO}$) is the gain for the oscillator in Hz/LSB. The digital control signal is converted by the oscillator 23 into the frequency output ($f_{OUT}$), expressed as the gain ($K_{DCO}$). The output clock signal passing through the counter 24 is integrated into feedback phase information ($\Phi_{DCO}$)).

$$\Delta\Phi_{DCO} = \Sigma\{[\Sigma b(i) \cdot K_{ip} + \Delta C] \cdot K_{DCO}\} \qquad \text{Equation (2)}$$

Equation (3) can be used to express the situation when Equation 2 is established before or after the phase quantizer. The physical meaning of this situation is the difference between the excess reference phase information ($\Delta\Phi_{REF}$) and the excess feedback phase information ($\Delta\Phi_{DCO}$). After quantization, it becomes the output (b(i)) of the phase quantizer.

$$\Delta\Phi_{REF} - \Delta\Phi_{DCO} = b(i) \qquad \text{Equation (3)}$$

Equation (4) is obtained by introducing Equations (1) and (2) into Equation (3):

$$\sum \left\{ [-b(i)] \cdot \frac{K_{pd}}{M_{dsm}} \cdot f_{REF} \right\} - \sum \left\{ \left[ \sum b(i) \cdot K_{ip} + \Delta C \right] \cdot K_{DCO} \right\} = b(i) \qquad \text{Equation (4)}$$

When phase is locked in the PLL, the output frequency ($f_{OUT}$) of oscillator 23 is of a constant value, so that the digital frequency tuning word for the input of the oscillator 23 must also be of a constant value. This digital frequency tuning word is the output of the loop filter 22. Since the loop filter 22 can be an integrator, the input of the loop filter 22, which is the output (b(i)) of the phase quantizer, is the differential result of a constant. In other words, when phase is locked, the average of the output (b(i)) of the phase quantizer is zero. The average ($\overline{b(i)}$) of the output (b(i)) of the phase quantizer is defined as the expected value of N reference frequency cycles. Both sides of Equation (4) are averaged to obtain Equation (5).

$$f_{REF} \cdot \frac{K_{pd}}{M_{dsm}} \cdot \sum \overline{[-b(1)]} - K_{DCO} \cdot \sum [\Delta C + K_{ip} \cdot \sum \overline{b(1)}] = \overline{b(1)} = 0 \qquad \text{Equation (5)}$$

The terms in Equation (5) are rearranged to obtain the gain of the oscillator as shown in Equation (6), that is, the estimated gain information.

$$K_{DCO} = \frac{f_{REF} \cdot \frac{K_{pd}}{M_{dsm}} \cdot \sum \overline{[-b(1)]}}{\sum [\Delta C + K_{ip} \cdot \sum \overline{b(1)}]} \qquad \text{Equation (6)}$$

Figure 1:
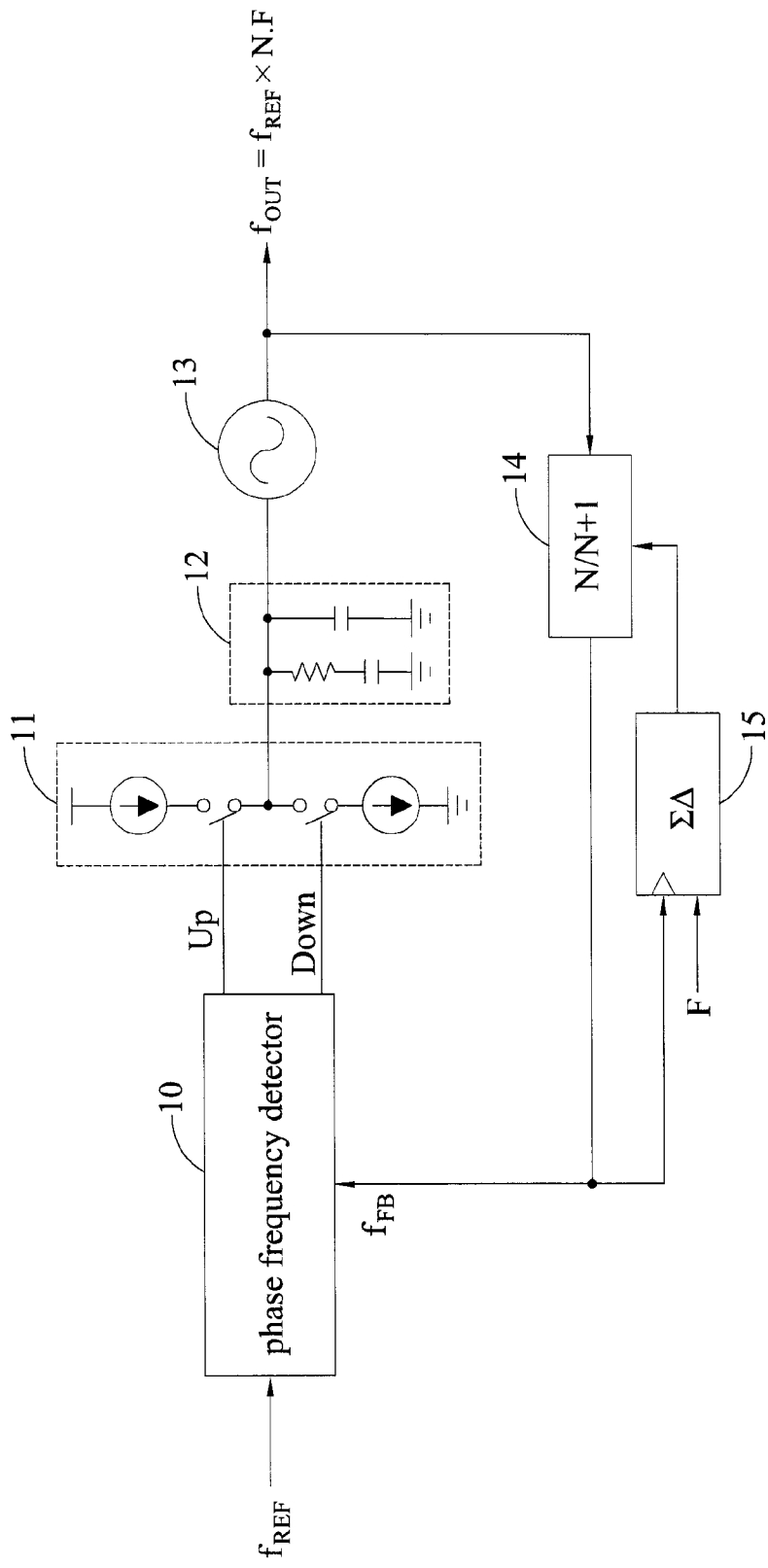
FIG. 1 is a schematic diagram showing the structure of a traditional non-integer frequency synthesizer.
Figure 4A:
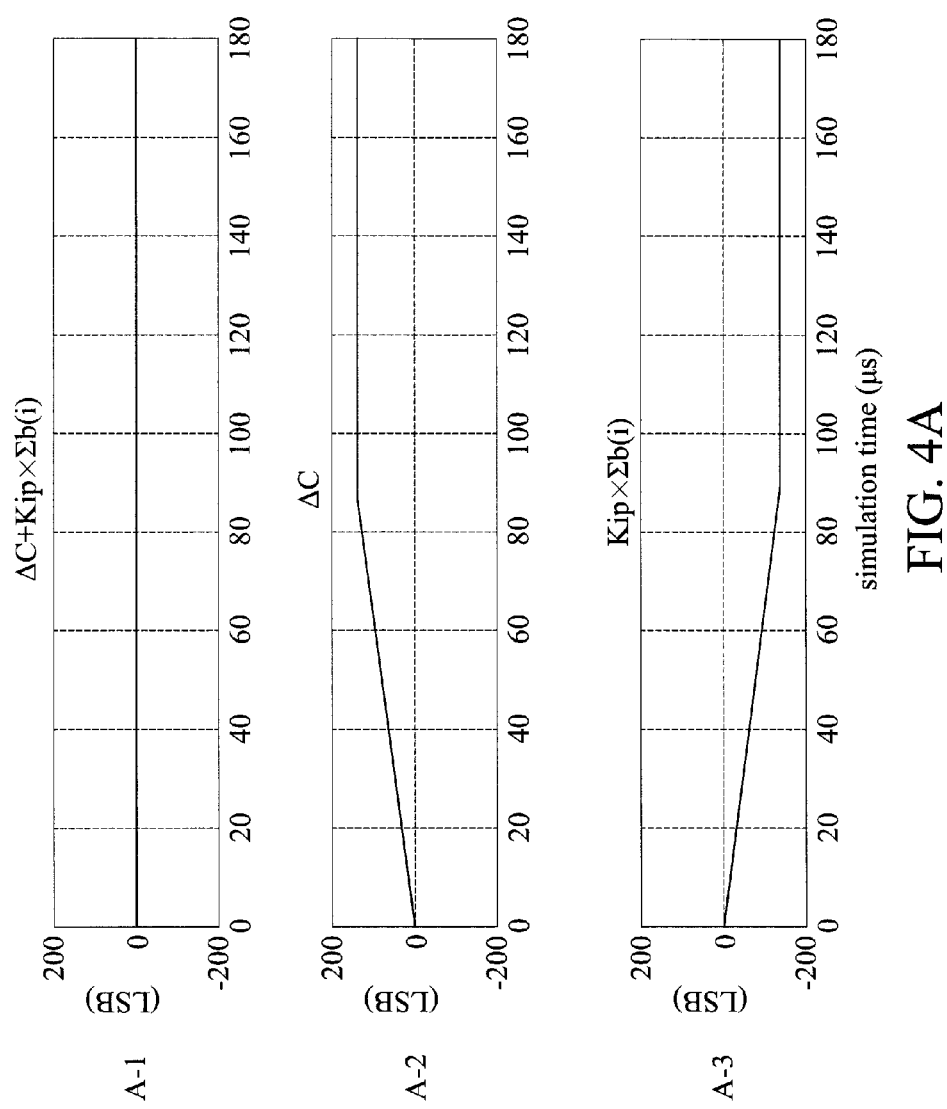
FIG. 4A shows the changes in a frequency tuning word, a varying code and an output of a loop filter in the frequency synthesizer with loop gain calibration in accordance with the present invention.
Figure 4B:
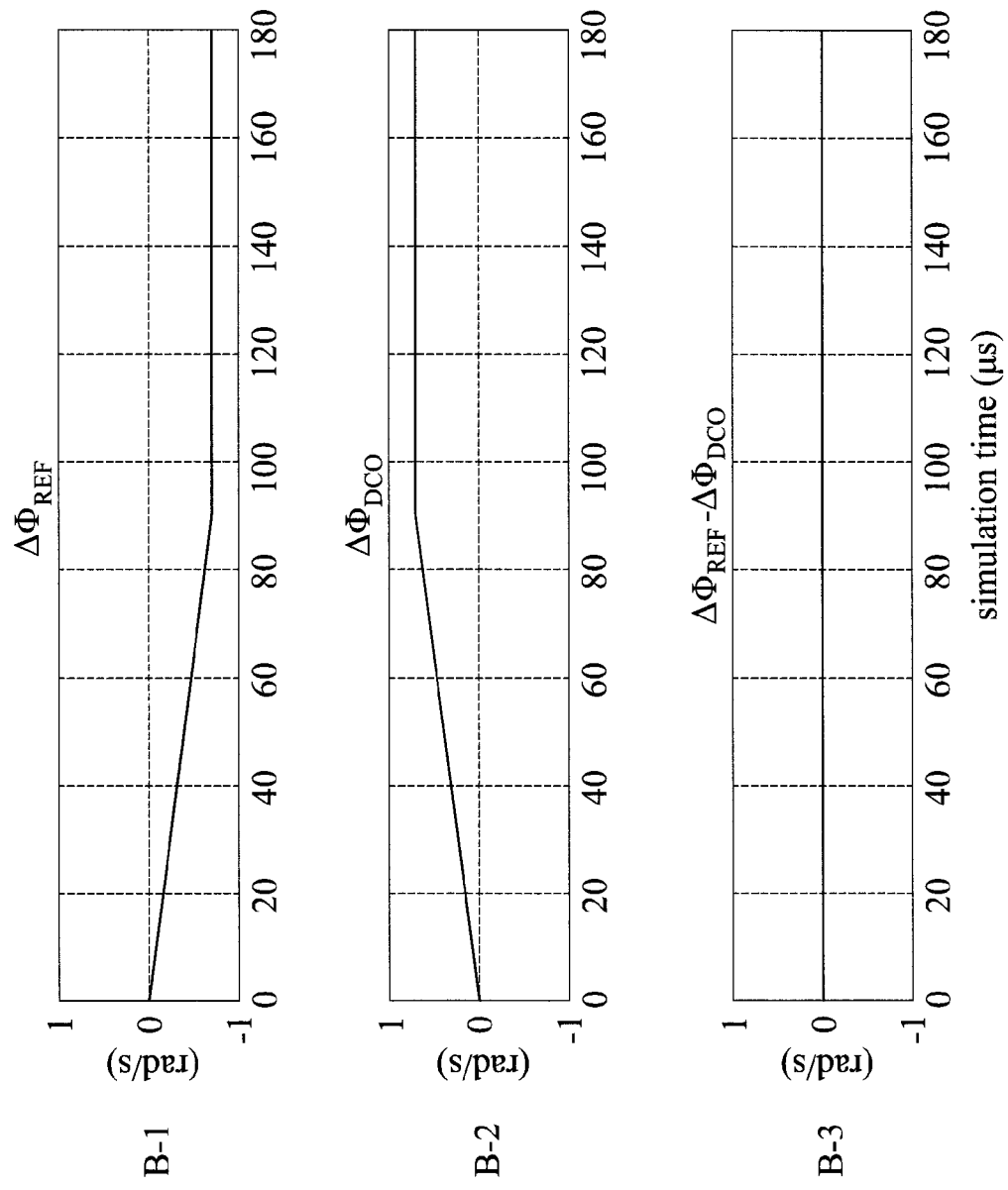
FIG. 4B shows the changes in excess reference phase information, excess feedback phase information and excess phase difference information in the frequency synthesizer with loop gain calibration in accordance with the present invention.

Since the method for measuring the gain is based on phase locking, the slowly changing varying code ($\Delta C$) of the present invention has a ladder-type waveform, which changes its value after a period of no change until phase lock is fully established and thereafter Equation (6) is used to estimate the gain of the oscillator. The result of simulation is shown in FIG. 4A. FIG. 4A-2 shows that the slowly changing varying code ($\Delta C$) introduced will rise for a period of time and then maintain constant for another period of time until the phase is locked. FIG. 4A-3 shows the output of the loop filter 22. It can be observed that the output of the loop filter 22 will eventually produce a change that is equal but opposite to the slowly changing varying code ($\Delta C$) introduced, and its mathematical representation would be $\Delta C + K_{ip} \cdot \Sigma b(i)$. FIG. 4A-1 indicates the digital frequency tuning word before the oscillator 23, and its value is the sum of the slowly changing varying code ($\Delta C$) introduced and the output ($K_{ip} \cdot \Sigma b(i)$) of the loop filter 22. It is observed that if the speed of change of the slowly changing varying code ($\Delta C$) is within the bandwidth of the PLL, then the frequency error can be fully offset. The speed of change of the slowly changing varying code ($\Delta C$) used in this simulation is $F_{REF}/10^3=156$ kHz, and the bandwidth of the PLL is designed to be at 1 MHz. FIG. 4B-1 shows the negative value of the estimated excess reference phase information ($\Delta \Phi_{REF}$), and its mathematical representation is shown by Equation (1). FIG. 4B-2 shows the estimated excess feedback phase information ($\Delta \Phi_{DCO}$), and its mathematical representation is shown by Equation (2). FIG. 4B-3 shows the difference between the estimated excess reference phase information ($\Delta \Phi_{REF}$) and the estimated excess feedback phase information ($\Delta \Phi_{DCO}$). It is observed that the average is zero, and its mathematical representation is shown by Equation (3).

Figure 5B:
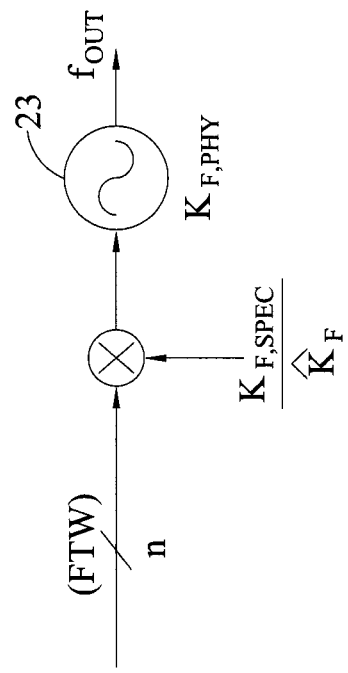
FIGS. 5A and 5B are schematic diagrams illustrating the frequency synthesizer with oscillator gain calibration before and after gain calibration, respectively, in accordance with the present invention.
Figure 5A:
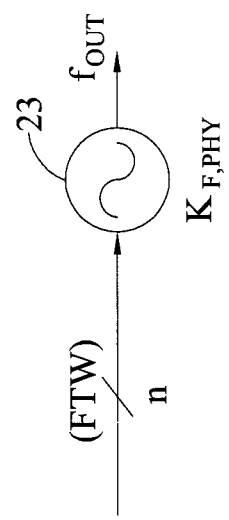

After using the aforementioned method for measuring the gain of the oscillator to obtain the estimated gain of this physical oscillator, a method for calibrating the oscillator gain is then developed to achieve stability in the loop bandwidth. FIG. 5A is a schematic diagram depicting an oscillator, wherein ($K_{F,SPEC}$) represents the output frequency range of a target oscillator in Hz. The selections of the loop bandwidth and loop parameters are based on the gain of this target oscillator. ($K_{F,PHY}$) represents the output frequency range of the physical oscillator in Hz. In reality, the output frequency range ($K_{F,PHY}$) of the physical oscillator is different from the output frequency range ($K_{F,SPEC}$) of a target oscillator due to variations in the manufacturing process. The frequency tuning word (FTW) has n bits. If the FTW is a two's complement number, the range can be expressed as $-2^{n-1} \leq FTW \leq 2^{n-1}-1$ with $2^n$ different levels, so that the output frequency of the oscillator can be expressed in Equation (7) below, wherein $$\frac{K_{F,PHY}}{2^n}$$

is the gain of the physical oscillator in Hz/LSB.

$$f_{out} = FTW \cdot \frac{K_{F,PHY}}{2^n} + f_0 \qquad \text{Equation (7)}$$

wherein $f_0$ is the free running frequency. By multiplying with a gain correcting factor before the oscillator 23, the frequency tuning word (FTW) is scaled by the gain correcting factor, which is equivalent to calibrating the gain value $$\frac{K_{F,PHY}}{2^n}$$

of the oscillator 23. The proposed oscillator gain calibration method is shown in FIG. 5B, wherein $\hat{K}_F$ is the physical oscillator gain estimated using Equation (6). Likewise, the output frequency of FIG. 5B can be expressed as Equation (8) below, wherein the gain correcting factor is $$\frac{K_{F,SPEC}}{\hat{K}_F} \cdot f_{OUT} = FTW \cdot \frac{K_{F,SPEC}}{\hat{K}_F} \cdot \frac{F_{F,PHY}}{2^n} + f_0 \qquad \text{Equation (8)}$$

Since $\hat{K}_F$ is the physical oscillator gain estimated using Equation (6), it should be considerably close to the physical oscillator gain ($K_{F,PHY}$), so that the physical oscillator gain ($K_{F,PHY}$) in the numerator of Equation (8) can substantially cancel out the estimated physical oscillator gain in the denominator to obtain Equation (9).

$$f_{OUT} = FTW \cdot \frac{K_{F,SPEC}}{2^n} + f_0 \qquad \text{Equation (9)}$$

From Equations (7) and (9), it is found that after FTW is multiplied by the gain correcting factor $$\left(\frac{K_{F,SPEC}}{\hat{K}_F}\right),$$

the equivalent gain of the oscillator observed is the same as the gain of the target oscillator ($K_{F,SPEC}$). In other words, the above target gain information achieves the effect of oscillator gain calibration.

In addition, oscillator gain calibration can be achieved in hardware.

Figures 6A, 6B:
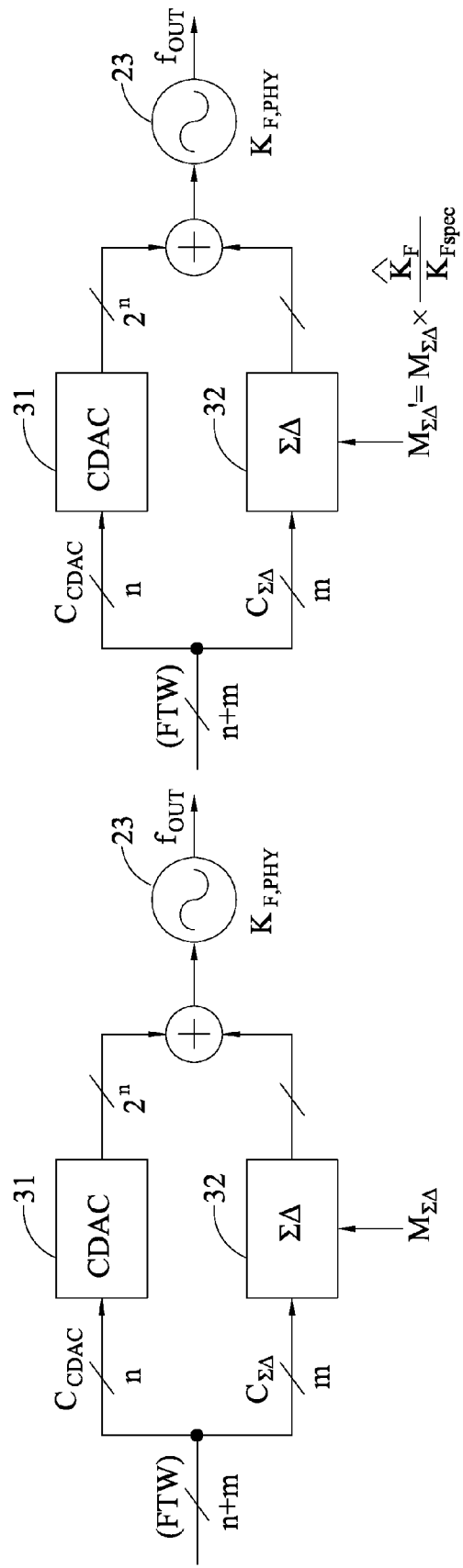
FIGS. 6A and 6B are schematic diagrams illustrating another frequency synthesizer with loop gain calibration before and after gain calibration, respectively, in accordance with the present invention.

The present invention may use a current DAC (CDAC) 31 and a delta-sigma modulator ($\Sigma\Delta$) 32 to controlling the oscillator, as shown in FIG. 6A. In this case, the output frequency ($f_{OUT}$) can be expressed by Equation (10), $$f_{OUT} = C_{CDAC} \cdot \frac{K_{F,PHY}}{2^n} + C_{\Sigma\Delta} \cdot \frac{1}{M_{\Sigma\Delta}} \cdot \frac{K_{F,PHY}}{2^n} + f_0 \quad \text{Equation (10)}$$

wherein $C_{CDAC}$ is an input word for the CDAC 31 using binary encoding, meaning that an n-bit input will give rise to an output with $2^n$ possible current levels. $K_{F,PHY}$ is the frequency range of the physical oscillation in Hz, so that the gain of the physical oscillator can be expressed as $$\frac{K_{F,PHY}}{2^n}$$

in Hz/LSB. $C_{\Sigma\Delta}$ is an input word for the delta-sigma modulator 32. $M_{\Sigma\Delta}$ is the resolution of the delta-sigma modulator 32. The signal of the delta-sigma modulator 32 being divided by the resolution $M_{\Sigma\Delta}$ indicates the concept of averaging. Since a minimum frequency for an output change of the delta-sigma modulator 32 is the same as the minimum frequency for a change of the product error code 31, the gain of the physical oscillator controlled by the output of the delta-sigma modulator 32 is also $$\frac{K_{F,PHY}}{2^n}.$$

Since a signal going through the delta-sigma modulator of high-speed disturbance can be reduced by the resolution $M_{\Sigma\Delta}$ of the delta-sigma modulator 32, which represents the concept of averaging in the time domain, the resolution of the delta-sigma modulator 32 can thus be modified to achieve the equivalent effect of multiplying a gain correcting factor before the oscillator, as shown in FIG. 6B, so that the FTW after being scaled by the gain correcting factor is equivalent to calibrating the gain of the oscillator 23 to $$\frac{K_{F,SPEC}}{2^n}.$$

However, the resolution of the delta-sigma modulator 32 influences the denominator of the oscillator gain, so that the previous gain correcting factor $$\left(\frac{K_{F,SPEC}}{\hat{K}_F}\right)$$

multiplied before the oscillator 23 will have to be inverted for adjusting the resolution of the delta-sigma modulator 32. In other words, the resolution $M'_{\Sigma\Delta}$ of the delta-sigma modulator 32 after adjustment equals to the original resolution $M_{\Sigma\Delta}$ of the delta-sigma modulator 32 multiplied by $$\frac{\hat{K}_F}{K_{F,SPEC}}$$

as shown in Equation (11) below.

$$M'_{\Sigma\Delta} = M_{\Sigma\Delta} \times \frac{\hat{K}_F}{K_{F,SPEC}} \quad \text{Equation (11)}$$

Meanwhile, the output frequency after adjustment can be represented by Equation (12)

$$f_{OUT} = C_{CDAC} \cdot \frac{K_{K,PHY}}{2^n} + C_{\Sigma\Delta} \cdot \frac{1}{M_{\Sigma\Delta}} \cdot \frac{K_{F,PHY}}{2^n} + f_0 \quad \text{Equation (12)}$$

Equation (13) is obtained by introducing Equation (11) into Equation (12):

$$f_{OUT} = C_{CDAC} \cdot \frac{K_{F,PHY}}{2^n} + C_{\Sigma\Delta} \cdot \frac{1}{M'_{\Sigma\Delta}} \cdot \frac{K_{F,PHY}}{2^n} + f_0 \quad \text{Equation (13)}$$

Since $\hat{K}_F$ is the physical oscillator gain estimated using Equation (6), it should be considerably close to the physical oscillator gain ($K_{F,PHY}$), so that the physical oscillator gain ($K_{F,PHY}$) in the numerator of Equation (13) can substantially cancel out the estimated physical oscillator gain $\hat{K}_F$ in the denominator to obtain Equation (14). From Equations (10) and (14), it is clear that after FTW is passed through the delta-sigma modulator with a maximum resolution of $M'_{\Sigma\Delta}$ the gain of the oscillator observed changes from the physical oscillator gain ($K_{F,PHY}$) to the gain of the target oscillator ($K_{F,SPEC}$), thereby achieving the effect of oscillator gain calibration.

$$f_{OUT} = C_{CDAC} \cdot \frac{K_{F,PHY}}{2^n} + C_{\Sigma\Delta} \cdot \frac{1}{M_{\Sigma\Delta}} \cdot \frac{K_{F,SPEC}}{2^n} + f_0 \quad \text{Equation (14)}$$

Second Example

Clock jitter is an important indicator for assessing the merits of a phase-locked loop. Traditionally, the performance of a phase-locked loop is mostly assessed by measuring clock jitter using an external instrument, but with the increase in the output frequency of the phase-locked loop, the cost of the measurement instrument greatly increases. Therefore, a method for estimating the amount of jitter on the chip involves calculating jitter noise by using the frequency tuning word (FTW) at the input end of the oscillator, which lowers the measuring frequency from the output frequency down to the reference frequency. This considerably reduces the cost of the measurement instrument.

Figure 7:
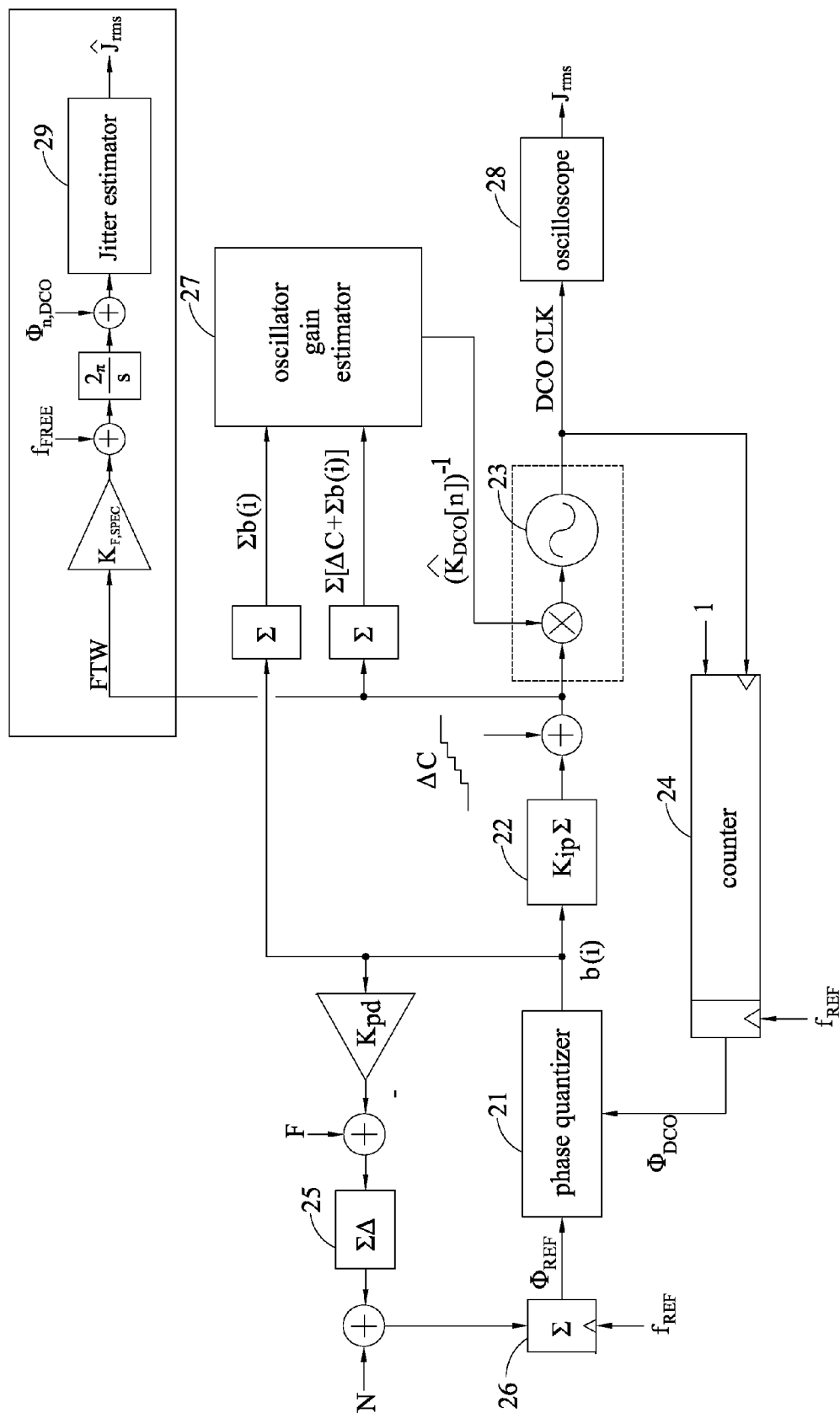
FIG. 7 illustrates a mechanism for jitter measurement in the frequency synthesizer with loop gain calibration in accordance with the present invention.

In an all digital phase locked loop (ADPLL) shown in FIG. 7 similar to that described above, the bandwidth is determined by the known parameter of the digital loop (weight of the loop filter 22 ($K_{ip}$)), the weight $K_{pd}$ of the reference phase integral path B, the maximum resolution ($M_{dsm}$) of the delta-sigma modulator, the integer frequency tuning word (N), the fractional frequency tuning word (F), and the parameter of the analog loop (the gain ($K_{DCO}$) of the oscillator 23), and among which, only the gain of the oscillator ($K_{DCO}$) is affected by process-voltage-temperature (PVT) variations.

The method for measuring jitter of a phase-locked loop of the present invention includes the following steps of after calibrating the gain of the oscillator 23, obtaining the FTW at the input end of the oscillator, and calculating an estimated amount of jitter Ĵ by a jitter estimator 29 based on the product of the FTW multiplied by a target gain information $K_{F,SPEC}$ and a center frequency $f_{FREE}$.

In addition, if the physical gain of the oscillator ($K_{F,PHY}$) in the chip is found and the physical gain ($K_{F,PHY}$) is replaced with the target oscillator gain ($K_{F,SPEC}$), the loop bandwidth is recovered without changing other parameters. After the bandwidth is calibrated, the amount of jitter estimated using the FTW before the oscillator ($\hat{J}_{rms}$) is compared with the amount of jitter found during measurement ($J_{rms}$), and if there is a match between the two jitter distributions, then the accuracy of the loop bandwidth calibration is validated.

After the bandwidth is calibrated, if the jitter noise distribution of the output clock of the oscillator 23 measured by an oscilloscope 28 is $J_{rms}$, there are three premises that need to be satisfied for it to match the jitter noise measurement inside the chip ($\hat{J}_{rms}$): (1) the oscillator gain in the chip after calibration must equal to the known target oscillator gain ($K_{F,SPEC}$); (2) the proposed jitter estimating method must be the same as the jitter measuring method of the oscilloscope; and (3) the noise within the bandwidth of the PLL must be determined by the reference noise.

Figure 8B:
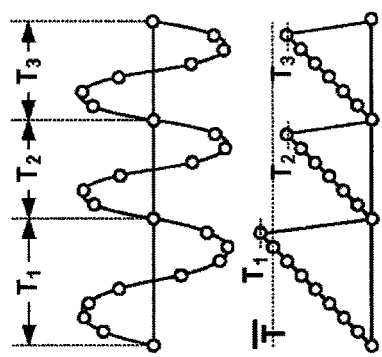
FIGS. 8A and 8B illustrate methods for measuring jitter under an ideal clock and a clock with noise jitter, respectively, in accordance with the present invention.
Figure 8A:
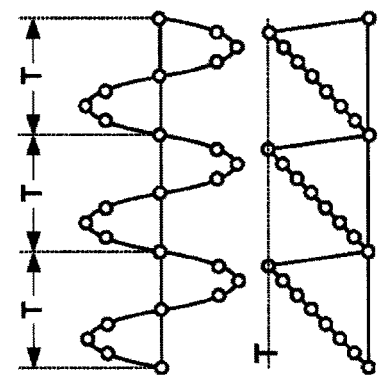

In order to calculate the amount of jitter, it is essential to identify each clock period. As shown in FIG. 8A, 8 sampling points are taken in an ideal clock with a frequency of f and a period of T (T=1/f), indicating that the time interval between each sampling point is T/8. Since phase is the integral of the frequency, phase information will be increased by 2π/8. By dividing this phase information with the remainder of 2π and then normalizing 2π, a triangular waveform shown in FIG. 8A can be obtained. By observing the upper and lower graphs shown in FIG. 8A, it can be seen that at the end of each cycle, the phase divided by the remainder of 2π shows a change in the polarity of the slope. In other words, the value of the phase information changes from increasing to decreasing. The time at this point can be regarded as the end of a period. Similarly, FIG. 8B shows a clock with phase noise. The time for the phase divided by the remainder of 2π to show a change in the polarity of the slope can be regarded as the time length of the period. By averaging over sufficient large number (N) of periods, and using the expected value of N periods as the ideal clock period T̄, the difference between each clock cycle $T_{cycle,n}$ and the ideal clock period T̄ can be defined as period jitter, and its mathematical representation is $$T_{jit(per),n} = T_{cycle,n} - \bar{T} \quad \text{Equation (15)}$$

wherein $$\bar{T} = \frac{\sum_{n=n_0}^{n_0+N-1} T_{jit(per),n}}{N},$$

$$n_0 \geq 1$$

If the integral value of the phase noise in the frequency domain is the rms jitter, and the actual rms jitter is $J_{rms}$, then by extracting the FTW through the oscillator the same with that within the loop, and using the aforementioned method for estimating the amount of jitter, the output clock can be sampled to estimate the amount of rms jitter ($\hat{J}_{rms}$). In summary, the frequency synthesizer with loop gain and bandwidth calibration, the methods for oscillator gain measurement, gain calibration and jitter measurement in accordance with the present invention eliminate the influence of PVT variations. Without affecting the operation of phase locking, a low-frequency disturbance (i.e. the varying code) is introduced into the input end of the oscillator to produce a corresponding signal at the output end of the loop oscillator, thereby obtaining the gain of the oscillator. By measuring the oscillator gain information and using it as the basis for digitally calibrating the oscillator gain, stability in the loop bandwidth is achieved. Moreover, with the method for measuring jitter in accordance with the present invention, the cost of the measurement instrument is reduced and its specification is simplified, so as to provide immediacy and convenience.

The above embodiments are only used to illustrate the principles of the present invention, and should not be construed as to limit the present invention in any way. The above embodiments can be modified by those with ordinary skill in the art without departing from the scope of the present invention as defined in the following appended claims.

What is claimed is:

1. A method for measuring an oscillator gain of a phase-locked loop (PLL), in which the PLL includes a feedback phase integral path with a loop filter, an oscillator, and a counter, a reference phase integral path with a delta-sigma modulator and an accumulator, and a phase quantizer for comparing outputs of the feedback phase integral path and the reference phase integral path, the method comprising the following steps of:
   (1) providing a varying code at an input end of the oscillator;
   (2) outputting excess reference phase information by the reference phase integral path and outputting excess feedback phase information based on the varying code by the feedback phase integral path; and
   (3) obtaining an estimated gain information of the oscillator based on the excess reference phase information and the excess feedback phase information.

2. The method of claim 1, wherein step (3) further includes calculating a difference between the excess reference phase information and the excess feedback phase information to produce phase difference information, and allowing the phase difference information to become zero at a steady state in order to obtain the estimated gain information of the oscillator.

3. The method of claim 1, wherein a speed of changes of the varying code is within the bandwidth of the PLL.

4. A method for calibrating a loop gain of a phase-locked loop (PLL), in which the PLL includes a feedback phase integral path with a loop filter, an oscillator and a counter, a reference phase integral path with a delta-sigma modulator and an accumulator, and a phase quantizer for comparing outputs of the feedback phase integral path and the reference phase integral path, the method comprising the following steps of:
   (1) providing a varying code at an input end of the oscillator;
   (2) outputting excess reference phase information by the reference phase integral path and outputting excess feedback phase information based on the varying code by the feedback phase integral path;
   (3) obtaining estimated gain information of the oscillator based on the excess reference phase information and the excess feedback phase information;
   (4) obtaining a gain correcting factor based on a target gain information and the estimated gain information; and
   (5) controlling an output frequency of the oscillator using a product of a frequency tuning word multiplied by the gain correcting factor in order to calibrate the gain of the oscillator.

5. The method of claim 4, wherein the gain correcting factor is a ratio of the target gain information to the estimated gain information.

6. The method of claim 4, wherein a speed of changes of the varying code is within the bandwidth of the PLL.

7. A method for measuring jitter noise of an output signal of a phase-locked loop (PLL), in which the PLL includes a feedback phase integral path with a loop filter, an oscillator and a counter, a reference phase integral path with a delta-sigma modulator and an accumulator, and a phase quantizer for comparing outputs of the feedback phase integral path and the reference phase integral path, the method comprising the following steps of:
  (1) obtaining a frequency tuning word while the loop is stable after calibrating the gain of the oscillator; and
  (2) calculating an estimated amount of jitter noise of the oscillator based on a product of the frequency tuning word at an input end of the oscillator multiplied by a target gain information and a center frequency of the frequency tuning word.

8. The method of claim 7, wherein step (1) further includes:
  (1-1) providing a varying code at the input end of the oscillator;
  (1-2) outputting excess reference phase information by the reference phase integral path and outputting excess feedback phase information based on the varying code by the feedback phase integral path;
  (1-3) obtaining estimated gain information of the oscillator based on the excess reference phase information and the excess feedback phase information;
  (1-4) obtaining a gain correcting factor based on the target gain information and the estimated gain information; and
  (1-5) controlling an output frequency of the oscillator by using a product of the frequency tuning word multiplied by the gain correcting factor in order to calibrate the gain of the oscillator.

9. A frequency synthesizer with loop gain calibration, comprising:
  a feedback phase integral path including:
    a loop filter outputting a frequency tuning word;
    an oscillator receiving a varying code and the frequency tuning word and generating an output frequency; and
    a counter receiving the output frequency and calculating rising or falling edges of the output frequency to generate excess feedback phase information;
  a reference phase integral path including:
    a delta-sigma modulator receiving a sum of a fractional frequency tuning word and phase difference information; and
    an accumulator accumulating a sum of an output of the delta-sigma modulator and an integer frequency tuning word and outputting excess reference phase information based on a reference frequency;
  a phase quantizer comparing the excess feedback phase information and the excess reference phase information and outputting the phase difference information to the feedback phase integral path and reference phase integral path; and
  a gain estimator receiving the phase difference information, calculating estimated gain information of the oscillator based on the phase difference information, and calculating a gain correcting factor based on a target gain information and the estimated gain information to allow the oscillator to adjust the output frequency based on a product of the frequency tuning word multiplied by the gain correcting factor.

\* \* \* \* \*